(12) United States Patent
Lin et al.

(10) Patent No.: US 12,196,942 B2
(45) Date of Patent: Jan. 14, 2025

(54) DEVICE AND A METHOD FOR IMAGING OF MICROSCOPIC OBJECTS

(71) Applicant: IMEC VZW, Leuven (BE)

(72) Inventors: Ziduo Lin, Heverlee (BE); Murali Jayapala, Kessel-Lo (BE); Geert Vanmeerbeeck, Keerbergen (BE); Abdulkadir Yurt, Heverlee (BE)

(73) Assignee: IMEC VZW, Leuven (BE)

( * ) Notice: Subject to any disclaimer, the term of this patent is extended or adjusted under 35 U.S.C. 154(b) by 621 days.

(21) Appl. No.: 17/555,792

(22) Filed: Dec. 20, 2021

(65) Prior Publication Data

US 2022/0197003 A1    Jun. 23, 2022

(30) Foreign Application Priority Data

Dec. 21, 2020  (EP) ..................................... 20215954

(51) Int. Cl.
*G02B 21/36*  (2006.01)
*G02B 21/06*  (2006.01)
(Continued)

(52) U.S. Cl.
CPC .......... *G02B 21/365* (2013.01); *G02B 21/06* (2013.01); *H01L 27/14649* (2013.01); *H01L 31/03046* (2013.01); *H01L 31/035218* (2013.01)

(58) Field of Classification Search
None
See application file for complete search history.

(56) References Cited

U.S. PATENT DOCUMENTS

2019/0310584 A1* 10/2019 Lin ...................... G03H 1/0465

FOREIGN PATENT DOCUMENTS

| EP | 2657792 A1 | 10/2013 |
| EP | 3339963 A1 | 6/2018 |
| EP | 3460585 A1 | 3/2019 |

OTHER PUBLICATIONS

Lee Jiwon et al., "Imaging in Short-Wave Infrared with 1.82 um Pixel Pitch Quantum Dot Image Sensor", 2020 IEEE International Electron Devices Meeting (IEDM), IEEE, Dec. 12, 2020.
(Continued)

*Primary Examiner* — Robert E. Tallman
(74) *Attorney, Agent, or Firm* — MOSER TABOADA (57) ABSTRACT

According to an aspect of the present inventive concept there is provided a device for imaging of a microscopic object, the device comprising:
  an array of light sensitive areas sensitive to detect light spanning a wavelength range of at least 400-1200 nm;
  at least one light source comprising at least a first point of operation in which the at least one light source is configured to generate visible light, and a second point of operation in which the at least one light source is configured to generate infrared light, and being arranged to illuminate the microscopic object such that light is scattered by the microscopic object;
  wherein the array of light sensitive areas is configured to detect an interference pattern formed between the scattered light and non-scattered light;
  the device being configured to be set in a selected point of operation from the at least first and second points of operation, for detecting the interference pattern for imaging the microscopic object at a wavelength defined by the selected point of operation.

15 Claims, 4 Drawing Sheets

(51) Int. Cl.
*H01L 27/146* (2006.01)
*H01L 31/0304* (2006.01)
*H01L 31/0352* (2006.01)

(56) References Cited

OTHER PUBLICATIONS

Lee, Jiwon et al., "Image sensors for low cost infrared imaging and 3D sensing", Proc. of SPIE vol. 11407, 1140708, 2020 SPIE.
Extended European Search Report in EP20215954.7 dated Jun. 4, 2021.

* cited by examiner

DEVICE AND A METHOD FOR IMAGING OF MICROSCOPIC OBJECTS

CROSS-REFERENCE TO RELATED APPLICATIONS

This application claims benefit of EPC Application No. 20215954.7 filed on Dec. 21, 2020, which is herein incorporated by reference in its entirety.

TECHNICAL FIELD

The present inventive concept relates to a device and a method for imaging of microscopic objects, and more specifically to imaging of microscopic objects across a spectral range spanning from the visible to the short-wave infrared part of the spectrum.

BACKGROUND

Microscopy is widely used in research as well as in industrial applications. Information of microscopic objects for different wavelengths is often of interest and extending the spectral range of microscopy applications from the visible part of the spectral range into covering also the short-wave infrared, SWIR, range can often provide valuable information. However, extending the spectral range of microscopy instrumentation to span from visible up to SWIR is challenging because of the varying behavior of detectors and optical components across the wide spectral range.

Imaging detectors typically have a good sensitivity only in a limited spectral range, either dedicated for imaging in the visible range or the infrared range. Consequently, instrumentation intended to cover the range from visible to SWIR typically requires two different imaging detectors, one for visible and one for infrared. Thus, if spectral information ranging from visible to SWIR is desired for a microscopic object, a system that requires switching between the two detectors in order to cover the full range may need to be used. Further, also the microscope objectives need to be switched between applications in the visible and the SWIR part of the range. This introduces differences in chromatic aberrations, zoom, and other imaging distortions.

Alternatively, two different microscope instruments dedicated to imaging in different parts of the spectrum from visible to SWIR may be needed. Hence, acquisition of information relating to different wavelengths for a microscopic object may require cumbersome switching of an optical set-up or using two different microscope instruments.

It should also be realized that information for different wavelengths may be desired for imaging different microscopic objects. Thus, it may be desired to image a first microscopic object in a visible part of the range and to image a second microscopic object in a SWIR part of the range. Thus, even if a single microscopic object need not be imaged in a broad range of wavelengths, there may be a need, e.g. in a laboratory, for imaging in different parts of a broad wavelength range for different applications. Hence, the laboratory may need to have at least two microscope instruments, dedicated to different parts of the spectrum, or cumbersome changing of the optical set-up may be needed between different instances of imaging using a single instrumentation.

The need for replacing components when switching between different wavelength ranges is time consuming. As a result, the work flow of the personnel working with the instrumentation is slowed down. Furthermore, the need for replacing components also limits the data acquisition rate, and this limitation is especially pronounced in applications where data acquisition in both the visible and SWIR is needed for the same object.

The increased number of components further results in bulky and costly instrumentation. Therefore, there is a need in the art for an improved solution for imaging of microscopic objects covering the spectral range from visible to SWIR.

SUMMARY

An objective of the present inventive concept is to mitigate, alleviate or eliminate one or more of the above-identified deficiencies in the art and disadvantages singly or in any combination. These and other objects are at least partly met by the invention as defined in the independent claims. Preferred embodiments are set out in the dependent claims.

According to a first aspect of the present inventive concept there is provided a device for imaging of a microscopic object, the device comprising:

an array of light sensitive areas, each of the light sensitive areas being sensitive to detect light spanning a wavelength range of at least 400-1200 nm, at least one light source comprising at least a first point of operation in which the at least one light source is configured to generate light in a visible part of the wavelength range, and a second point of operation in which the at least one light source is configured to generate light in an infrared part of the wavelength range, the at least one light source being arranged to illuminate the microscopic object with the generated light such that at least part of the light is scattered by the microscopic object, forming scattered light;

wherein the device is configured to transmit the scattered light and non-scattered light, from the same light source, to the array of light sensitive areas, wherein the array of light sensitive areas is configured to detect an interference pattern formed by interference between the scattered light and the non-scattered light;

and wherein the device is further configured to be set in a selected point of operation from the at least first and second points of operation, for detecting the interference pattern for imaging the microscopic object at a wavelength defined by the selected point of operation.

The term "imaging" of a microscopic object is herein regarded to include also acquisition of the interference pattern. By acquisition of the interference pattern formed by interference between the scattered light from the microscopic object and the non-scattered light, information about the three-dimensional shape of the microscopic object is acquired in terms of a digital hologram. Such information enables generation of a visual image of the microscopic object, by means of holographic reconstruction.

By the term "light sensitive area" is here meant an area reacting to light impinging onto the area, by generating an electrical signal as a response to the light intensity. Arrays of light sensitive areas may be arranged on detectors, configured to allow read-out of the detected light for image acquisition. Given as non-limiting examples, light sensitive areas may be found on photodiodes, photo-multiplier tubes (PMT), and pixels on image sensors such as charge-coupled devices (CCD) and complementary metal oxide semiconductors (CMOS). By way of example, an array of light sensitive areas may be in the form of pixels on a CCD or CMOS sensor, but may alternatively comprise a plurality of any other type of light sensitive areas. Given as other non-limiting examples, an array of light sensitive areas may be of Indium Gallium Arsenide (InGaAs) type or of quantum dot image sensor type.

By the phrase "sensitive to detect light spanning a wavelength range" is here meant that the light sensitive area, as a reaction to light impinging onto the area, has the capability of generating an electrical signal as a response to light intensity for light of all wavelengths that fall within the defined wavelength range. Further, the light sensitive area may or may not be sensitive to light of wavelengths that fall outside of the defined wavelength range. A light sensitive area is considered sensitive to light of a certain wavelength if the light sensitive area has a quantum efficiency of 5% or greater, for that wavelength. It should be understood that if a light sensitive area is sensitive to detect light of a specific wavelength and a spectral filter blocking the wavelength is arranged in front of the light sensitive area, such that light with that specific wavelength is prevented from reaching the light sensitive area, the light sensitive area as such is still regarded as being sensitive to the specific wavelength.

In this context the term "light" should be allowed a wider interpretation, not limited to visible electromagnetic radiation but may also include for example ultra-violet light and infra-red light.

By the "visible" part of the wavelength spectrum is here meant electromagnetic radiation within the wavelength range of 380-750 nm.

By the "infrared (IR)" part of the wavelength spectrum is here meant electromagnetic radiation within the wavelength range of 750 nm to 1 mm.

By the "near infrared (NIR)" part of the wavelength spectrum is here meant electromagnetic radiation within the wavelength range of 750-1000 nm.

By the "short wave infrared (SWIR)" part of the wavelength spectrum is here meant electromagnetic radiation within the wavelength range of 1000-3000 nm.

By the term "light source" is here meant any unit, device and/or element at which light is generated. By way of example, the light source may be, but is not limited to a laser, a laser diode, a light emitting diode, or a combination thereof.

Generation of light in at least a visible part and an infrared part of the wavelength range, in the at least first and second points of operation, may be accomplished by a single light source being configured to generate light at said wavelengths. Generation of light in at least a visible part and an infrared part of the wavelength range, in the at least first and second points of operation, may alternatively be accomplished by a number of light sources combined, wherein each light source is configured to generate light at one wavelength within the wavelength range, each of the light sources being configured to generate light at different wavelengths such that light in at least a visible part and an infrared part of the wavelength range is generated by the combination of the number of light sources. It is conceivable that the one or more light sources may be configured to generate light also at other wavelengths not comprised within the at least visible part and infrared part of the wavelength range, in the at least first and second points of operation.

By the term "scattered light" is here meant elastically scattered light, thus light scattered such that the direction and/or phase and/or intensity of light may change but the energy of the photons, and thus the wavelength of the light is substantially unchanged, apart from a slight Doppler shift that may result from the movement of the sample. In other words, the scattering process does not involve any net energy transfer between the light and the scattering sample, in terms of e.g. change in electronic energy states of the atoms or molecules in the sample. Given as non-limiting examples, the elastic scattering may be, but is not limited to, Rayleigh or Mie scattering.

It is an insight of the inventive concept that imaging of microscopic objects over a wide range of wavelengths may be improved by using an array of light sensitive areas sensitive to a wide range of wavelengths and using detection of interference patterns to avoid microscope objectives or other optical components in an imaging system. This implies that a common setup may be used over a wide range of wavelengths.

An advantage with the present inventive concept is that with an array of light sensitive areas sensitive to detect light spanning the full range of intended use of the device, the need for switching between different arrays of light sensitive areas in order to detect light from the visible part to the IR part of the wavelength range, is eliminated.

Another advantage with the present inventive concept is that a microscope objective is not required in order to detect the interference pattern, thereby also eliminating the need for switching between different microscope objectives or other optical components when switching detection range from the visible part to the SWIR part of the wavelength range. Further, aberrations otherwise introduced in the imaging path by optical components are eliminated as well. Moreover, since a microscope objective is not required, the present inventive concept allows for the device to be made compact as well as at a relatively lower cost than objective-based devices.

Another advantage is that no re-alignment is required during operation. This allows for a more user-friendly device to be provided.

Thus, by the present arrangement, a versatile, compact, low cost device for aberration-free imaging of microscopic objects covering a wide spectral wavelength range from visible light to IR, without the need for switching components when switching between the different wavelengths, may be provided.

According to an embodiment, in the second point of operation, the light generated in the infrared part of the wavelength range is in a short-wave infrared, SWIR, part of the wavelength range.

By the present arrangement, the wavelength range in which the device is applicable is further extended to cover wavelengths from visible light to SWIR.

According to an embodiment, the at least one light source is configured to generate light having a spectral line-width equal to or less than 100 nm and being at least partially coherent, for each selected point of operation.

Coherent light may be advantageous as it improves the interference visibility. A coherent light source may be a laser. However, it should be understood that also partially coherent light may provide an interference pattern with sufficient visibility. A partially coherent light source may e.g. be a light emitting diode, LED, emitting light through a pinhole onto the microscopic object. A coherent light source may provide better interference visibility but may be more expensive while a partially coherent light source may provide a worse interference visibility but may be less expensive. It should further be realized that temporal coherence of the generated light is not important. Thus, the generated light may be at least partially spatially coherent, but need not be temporally coherent. The at least partially spatially coherent light may create an interference pattern, formed by interference between light scattered by the microscopic object and non-scattered light, at the array of light sensitive areas.

A narrow spectral line-width may be an advantage because it may facilitate matching the line-width of the light from the light source with the spectral band or bands of interest to probe or measure at.

Another advantage of a narrow spectral line-width is that, if the plurality of wavelengths is acquired sequentially one by one, the requirement for spectral filtering in front of the array of light sensitive areas may be eliminated.

According to an embodiment, the at least one light source comprises one or more lasers and/or one or more laser diodes and/or one or more light emitting diodes, LEDs.

According to an embodiment, the array of light sensitive areas is of Indium Gallium Arsenide, InGaAs, type.

An advantage with this embodiment is that light sensitive areas of InGaAs type may provide relatively high quantum efficiency within the full spectral range in which the devices is intended to operate. High quantum efficiency may provide improved image quality of the detected interference patterns.

Another advantage with this embodiment is that it may allow for the use of lower power light sources than otherwise required in order to provide good image quality of the detected interference patterns.

According to an embodiment, the array of light sensitive areas is of quantum dot image sensor type.

An advantage with this embodiment is that light sensitive areas of quantum dot image sensor type may provide relatively high quantum efficiency within the full spectral range in which the devices is intended to operate. High quantum efficiency may provide improved image quality of the detected interference patterns.

Another advantage with this embodiment is that it may allow for the use of lower power light sources than otherwise required in order to provide good image quality of the detected interference patterns.

Yet another advantage with this embodiment is that the wavelength range in which the quantum dots are sensitive to light can be tuned within the visible and infrared wavelength range. Such tuning may be achieved by selection of material and particle size, thereby adjusting what wavelength range is absorbed by the quantum dots. In the present manner, quantum dot image sensors may be tailor-made to match the desired wavelength range for visible/SWIR applications.

Yet another advantage with this embodiment is that it may provide a small pitch of the light sensitive areas. By small pitch of the light sensitive areas, higher image resolution of the acquired interference patterns may be provided.

According to an embodiment, a pitch of the light sensitive areas in the array of light sensitive areas is not larger than 100 μm.

By the term "pitch" is here meant the distance from a center of a light sensitive area to the center of a consecutive light sensitive area. In other words, the pitch includes a width of a light sensitive area as well as a separation between two consecutive light sensitive areas. The resolution of the acquired images is related to the pitch of the light sensitive areas. In order to obtain images with high spatial resolution, the pitch of the light sensitive areas needs to be sufficiently small. By way of example, arrays of light sensitive areas with a pitch of the light sensitive areas of 10 μm, preferably 5 μm, and more preferably 1 μm or smaller may be suitable for use in the device for imaging of microscopic objects.

According to an embodiment, the device may further comprise a processor configured to perform digital holographic reconstruction on the interference pattern detected by the array of light sensitive areas to generate a monochromatic image of the microscopic object at the wavelength defined by the selected point of operation.

The processor may be arranged internally in the device. Alternatively, the processor may be arranged in an external unit, such that the digital holographic reconstruction may take place elsewhere. Data of the interference patterns detected by the array of light sensitive areas may be transferred to the processor, either by a wired connection or wirelessly. As yet another alternative, the processor for performing digital holographic reconstruction may be distributed among physical units, such that parts of the digital holographic reconstruction may be performed in different physical units.

It should be understood that any suitable algorithm for performing the digital holographic reconstruction may be used, as known to the person skilled in the art, including a Gerchberg-Saxton algorithm or multi-acquisition (multi-depth and/or multi-wavelength) for phase retrieval, or reconstruction based on angular spectrum diffraction by means of Gabor wavelet transform. Further, algorithms for performing digital holographic reconstruction may include theories of diffraction, such as Fresnel, Fraunhofer and or Kirchhoff theories, or may be based on deep machine learning methods.

According to an embodiment, the device may be further configured to set the selected point of operation to the at least first and second points of operation sequentially or simultaneously, and wherein the array of light sensitive areas is configured to sequentially or simultaneously detect the interference patterns for imaging the microscopic object at each of the wavelengths defined by the at least first and second points of operation, and wherein the interference pattern detected at the first point of operation originates from a first part of the microscopic object, and the interference pattern detected at the second point of operation originates from a second part of the microscopic object, the second part of the microscopic object being different from the first part of the microscopic object.

In case of setting the selected point of operation to the at least first and second points of operation sequentially, the interference pattern detected in an image frame corresponding to a single exposure of the array of light sensitive areas originates from light at a single wavelength. Thus, the interference patterns at the wavelengths of the at least first and second points of operation may be detected and acquired in consecutive image frames. An advantage is that, since the microscopic object is illuminated by light at individual wavelengths one by one, leakage of information between the interference patterns at different wavelengths may be avoided.

In case of setting the selected point of operation to the at least first and second points of operation simultaneously, the interference patterns detected in an image frame originates from light at a more than one wavelength. Thus, the interference patterns at the wavelengths of the at least first and second points of operation may be detected and acquired in the same image frame.

The present embodiment may be useful in a number of application areas. Such applications may be where a first point of operation acquires an image of the full view of the microscopic object at lower resolution, analyses the image, and based on the result finds a region-of-interest of the microscopic object to which focus is turned in the second point of operation in which another property is measured at higher resolution. Such applications may further be imaging of microscopic objects for which some of the features can only be detected using light in the visible range, while some other features can only be detected using light in the SWIR range. By way of example, such applications may be investigations of pollen. The exine of the pollen may be imaged using light in the visible range at the first point of operation, whereas light in the SWIR range may penetrate the exine, and may thus be used for imaging the nucleus of the pollen, at the second point of operation. Another example may be a microfluidic application in which the flow is first investigated at a first point of operation, and as the flow progresses analysis is shifted to a second point of operation. In this manner the microscopic object, being in the field-of-view of the detector in both the first and the second points of operation but at different positions in the flow channel, is scanned for different morphological features as it moved through the flow channel.

According to an embodiment, the processor may be further configured to combine the monochromatic image of the microscopic object generated for each of the wavelengths defined by the at least first and second points of operation, thereby forming a chromatic image of the microscopic object.

According to an embodiment, the at least one light source further comprises a third point of operation in which the at least one light source is configured to generate light in a part of the wavelength range.

This implies a further versatility of the device as the device may be shifted to operate in further points of operation. It should be realized that the device may be configured to operate in a large number of points of operation within the wavelength range.

According to an embodiment, in the third point of operation, the light generated is in a near infrared, NIR, part of the wavelength range.

According to an embodiment:
the at least one light source is arranged at a first side of the microscopic object; and
the array of light sensitive areas is arranged at a second side of the microscopic object, wherein the second side of the microscopic object is opposite to the first side of the microscopic object;
wherein the at least one light source, the microscopic object and the array of light sensitive areas are further arranged to provide a light path from the at least one light source to the array of light sensitive areas through the microscopic object.

The non-scattered light from the light source may be passed along a common optical path with the light being scattered by the microscopic object. Thus, the interference pattern may be formed within a wavefront passing the microscopic object in a so-called in-line holography set-up. However, according to an alternative, the non-scattered light may be passed along a separate reference light path, which is combined with the light having been scattered by the microscopic object for reaching the array of light sensitive areas.

An advantage is that the in-line holographic set-up may be realized by a simple arrangement. Such a set-up may be preferred as an optical measurement method since it may be robust. Further advantages are that such a set-up may be compact and realized at low cost.

According to a second aspect of the present inventive concept there is provided a method for imaging of a microscopic object, the method comprising:
selecting a point of operation from at least a first point of operation in which at least one light source is configured to generate light in a visible part of a wavelength range of at least 400-1200 nm, and a second point of operation in which the at least one light source is configured to generate light in an infrared part of the wavelength range,
generating, by the at least one light source, light at a wavelength defined by the selected point of operation
illuminating the microscopic object with the generated light such that at least part of the light is scattered by the microscopic object, forming scattered light;
transmitting the scattered light and non-scattered light, from the same light source, to the array of light sensitive areas, such that an interference pattern is formed by interference between the scattered light and the non-scattered light; and
detecting, by an array of light sensitive areas, the interference pattern for imaging the microscopic object at the wavelength defined by the selected point of operation;
wherein each of the light sensitive areas of the array of light sensitive areas are sensitive to detect light spanning the wavelength range.

According to an embodiment, in the second point of operation, the light generated in the infrared part of the wavelength range is in a short-wave infrared, SWIR, part of the wavelength range.

Effects and features of the second aspect are largely analogous to those described above in connection with the first aspect. Embodiments mentioned in relation to the first aspect are largely compatible with the second aspect. It is further noted that the inventive concepts relate to all possible combinations of features unless explicitly stated otherwise.

Other objectives, features and advantages of the present inventive concept will appear from the following detailed disclosure, from the attached claims as well as from the drawings.

BRIEF DESCRIPTIONS OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

In cooperation with attached drawings, the technical contents and detailed description of the present inventive concept are described thereinafter according to a preferable embodiment, being not used to limit the claimed scope. This inventive concept may be embodied in many different forms and should not be construed as limited to the embodiments set forth herein; rather, these embodiments are provided for thoroughness and completeness, and fully convey the scope of the inventive concept to the skilled person.

Figure 1:
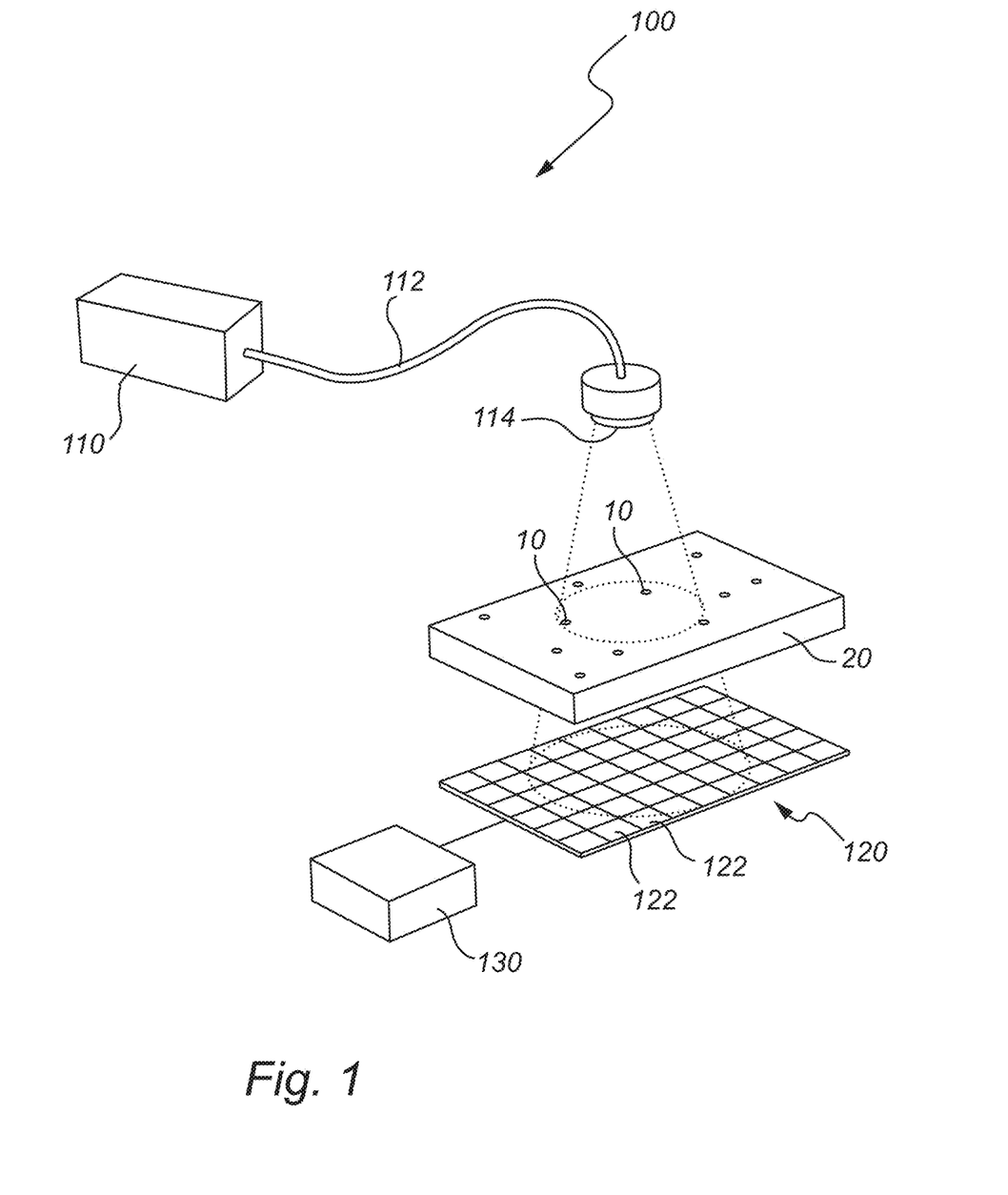
FIG. 1 illustrates a device for imaging microscopic objects comprising a light source with two points of operation, configured to generate light at a wavelength within a range of at least 400-1200 nm, defined by the selected point of operation.

FIG. 1 illustrates a device 100 for imaging microscopic objects 10, according to an embodiment of the inventive concept. The device 100 is configured to operate in points of operation within a wavelength range of at least 400-1200 nm. It should be realized that the device 100 may be set to at least two points of operation, but the device 100 may have many more points of operation, such as 10 points of operation, 50 points of operation or more than 100 points of operation.

The device comprises a light source 110, which in the present embodiment is a laser comprising a first point of operation in which the light source 110 is configured to generate light in a visible part of the wavelength range, and a second point of operation in which the light source 110 is configured to generate light in an infrared, IR, part of the wavelength range. The device 100 is further configured to be set in a selected point of operation from the first and second points of operation.

The light source 110 is configured such that the spectral line-width for each of the wavelengths does not exceed 100 nm, in order to avoid spectral overlap between the wavelengths. It should be realized that other spectral line-widths of the generated wavelengths may be provided, such as spectral line-widths that do not exceed 50 nm or spectral line-widths that do not exceed 10 nm. In particular, when the light source is a laser, a narrow spectral line-width may be provided.

The light from the light source 110 is guided by an optical fiber 112 to an output 114. The output 114 is arranged such that the light exiting the output 114 is directed towards a microscopic object 10. In this embodiment, an objective slide 20 is used on which microscopic objects 10 are arranged, and the microscopic objects 10 are thereby illuminated on the objective slide 20 from a first side of the objective slide 20.

It should be understood that, although the light source 110 is herein described as a laser, it is conceivable that the light source may alternatively be a laser diode or a light emitting diode, LED.

As the microscopic objects 10 are illuminated by light at a wavelength defined by the selected point of operation, at least part of the light is scattered by the microscopic objects 10, forming scattered light, whereas some of the light is non-scattered and passes through the microscopic objects 10 and the objective slide 20. The scattered and non-scattered light is transmitted to a detector 120 comprising an array of light sensitive areas 122, the detector 120 being arranged on a second side of the objective slide 20, opposite to the first side. At the detector 120, an interference pattern is formed by interference between light being scattered by the microscopic objects 10 and non-scattered light from the light source 110. By the present arrangement, non-scattered light may be transmitted along a common light path with the light scattered by the microscopic objects 10, in a so called in-line holography set-up. In alternative embodiments, however, scattered light and non-scattered light may be transmitted along separate light paths, being combined at the array of light sensitive areas 122 to form the interference pattern. Also, it should be realized that the array of light sensitive areas 122 may alternatively be arranged on the side of the microscopic objects 10 and the objective slide 20 from which the microscopic objects 10 are illuminated, with light transmitted through the microscopic objects 10 being reflected by a mirror towards the array of light sensitive areas 122 such that a reflective set-up is used instead of a transmissive set-up.

The array of light sensitive areas 122 is configured to detect the interference pattern, for imaging the microscopic objects 10 at the wavelength defined by the selected point of operation. Each of the light sensitive areas 122 are sensitive to detect light spanning the wavelength range of at least 400-1200 nm, thereby being able to detect light in the full range of wavelengths that the light source 110 may generate.

The array of light sensitive areas 122 of the detector may selectably be of either InGaAs type or quantum dot image sensor type. However, it should be realized that the array of light sensitive areas 122 may be formed by another image sensor type that is sensitive to detect light spanning the wavelength range of at least 400-1200 nm.

As the spatial resolution of the detected interference pattern is related to the pitch of the light sensitive areas 122 in the array of light sensitive areas 122, it is preferable to use a detector 120 with an array of light sensitive areas 122 having a small pitch, not larger than 100 μm. Provided as non-limiting examples, suitable detectors may have a pitch of 10 μm, 5 μm, or 2.5 μm.

The device 100 may optionally be configured to set the selected point of operation to the first and second points of operation sequentially, whereby the light source 110 may sequentially illuminate the microscopic objects 10 with the generated light at the wavelengths defined by the first and second points of operation. The device 100 is further configured to, by the array of light sensitive areas 122, sequentially detect the interference patterns for imaging the microscopic objects 10 at each of the wavelengths defined by the first and second points of operation. More specifically, the device 100 is configured such that each illumination event of the light source 110 is synchronized with a corresponding detection event of the array of light sensitive areas 122. The interference pattern detected at the first point of operation may originate from a different part of the microscopic objects 10 than the interference pattern detected at the second point of operation. By way of example, this may be applied for investigations of pollen. Light in the visible range in the first point of operation may be used for imaging the exine of the pollen, since light in the visible range is largely scattered by the exine of the pollen, whereas in the second point of operation the nucleus of the pollen may be images as light in the SWIR range may penetrate the exine of the pollen.

Application in which nanoparticles are used as holographic imaging labels may be another example. The shape and dimension of the nanoparticle determines spectral wavelength range at which the scattering cross-section of the particles is the highest. Thus, by using more than one type of differently shaped particles, different bio structures may be labeled. Thanks to the first and second points of operation being provided in a visible and an infrared part of the wavelength range, the spectral range in which nanoparticle labeling can be used may be extended. Such arrangement may find application in biosensing and invitro tissue imaging.

In an alternative embodiment, the device 100 may be configured to illuminate the microscopic objects 10 by light at the wavelengths defined by the first and second points of operation simultaneously, and the interference patterns of light at the two wavelengths may be detected simultaneously. Given as a non-limiting example, the interference patterns at the two wavelengths may be separated by means of an array of filters arranged in front of the array of light sensitive area 122, thereby allowing simultaneous detection of the individual interference patterns by the same detector 120. An example of such an array of filters is described in more detail in relation to FIG. 3, allowing simultaneous detection of up to three different wavelengths.

In the present embodiment, the light source 110 generates light at the two wavelengths defined by the first and second points of operation, and the light at the two wavelengths exit the light source through a common exit and the two wavelengths are pre-aligned on a common light path. The illumination therefore follows the same path for each of the two wavelengths. Further, no objective is used for imaging that may cause chromatic aberrations, and the interference patterns for each of the two wavelengths are detected by the same detector 120 with the array of light sensitive areas 122. Hence, the device 100 is configured to detect the interference patterns at the two wavelengths such that spatial information of the microscopic objects 10 in the interference patterns for each of the two wavelengths are aligned with each other on the array of light sensitive areas 122. The present arrangement enables combination of the information from each of the two wavelengths into chromatic information of the microscopic objects 10.

However, it should be realized that a microscopic object 10 may be imaged only at a single wavelength in a single point of operation. Thus, it is not necessary to use more than one point of operation when imaging a particular microscopic object 10. Nevertheless, the device 100 is versatile in that it may be used in different points of operation for different instances of imaging such that microscopic objects 10 that are to be imaged in vastly different wavelengths ranging from visible to SWIR part of the wavelength range may be imaged using the same device 100 without requiring any change in the set-up of the device 100 between different imaging instances.

The device 100 further comprises a processor 130 configured to perform digital holographic reconstruction on the interference patterns detected by the array of light sensitive areas 122. The digital holographic reconstruction for each wavelength detected generates a three-dimensional monochromatic image of the microscopic objects 10 on the objective slide 20. For the digital holographic reconstruction, the processor 130 may utilize any suitable algorithm as known to the person skilled in the art, including a Gerchberg-Saxton algorithm or multi-acquisition (multi-depth and/or multi-wavelength) for phase retrieval, or reconstruction based on angular spectrum diffraction by means of Gabor wavelet transform.

The processor 130 is further configured to optionally combine the monochromatic images of the microscopic objects 10 generated for each of the wavelengths, to form an aligned chromatic image of the microscopic objects 10. Since the spatial information of the microscopic objects 10 in the interference patterns for each of the wavelengths are aligned with each other on the array of light sensitive areas 122, combination of the monochromatic images may be performed without further intermediate image transformation such as resampling, rescaling, or dewarping, that may otherwise be required to align the image views of the different wavelengths.

The processor 130 may be implemented as a general-purpose processor, which may be provided with instructions, e.g. through computer programs for performing digital holographic reconstruction and for providing any other functionality of the processor 130. Thus, the processor 130 may for instance be a central processing unit (CPU).

The processor 130 may alternatively be implemented as firmware arranged e.g. in an embedded system, or as a specifically designed processor, such as an Application-Specific Integrated Circuit (ASIC) or a Field-Programmable Gate Array (FPGA).

It should be understood that the signal-to-noise ratio, SNR, of the detected interference patterns may decrease as the distance increases between the microscopic objects 10 and the array of light sensitive areas 122 of the detector 120. Thus, in order to ensure a good SNR, it may be preferable to have the objective slide 20 with the microscopic objects 10 arranged at a minimum distance from the array of light sensitive areas 122 of the detector 120. Thus, in a practical set-up it would be advantageous to have the objective slide 20 arranged in immediate proximity to the detector 120. In this respect, the illustrations in FIG. 1 as well as in subsequent figures are to be interpreted as schematic illustrations, wherein the objective slide 20 is illustrated at a distance away from the detector 120 for clear illustrational purposes only.

In the present embodiment, the microscopic objects 10 have been placed on a transparent objective slide 20 for easy handling of the microscopic objects 10 into and out from the device 100. However, it is conceivable that also other solutions for introducing and removing microscopic objects 10 to and from the location at which imaging of the microscopic objects 10 are performed. By way of example, the microscopic objects 10 can be placed on rotating disks, rolls of tape, or in flow channels through which liquid or gaseous flow may pass.

Figure 2A:
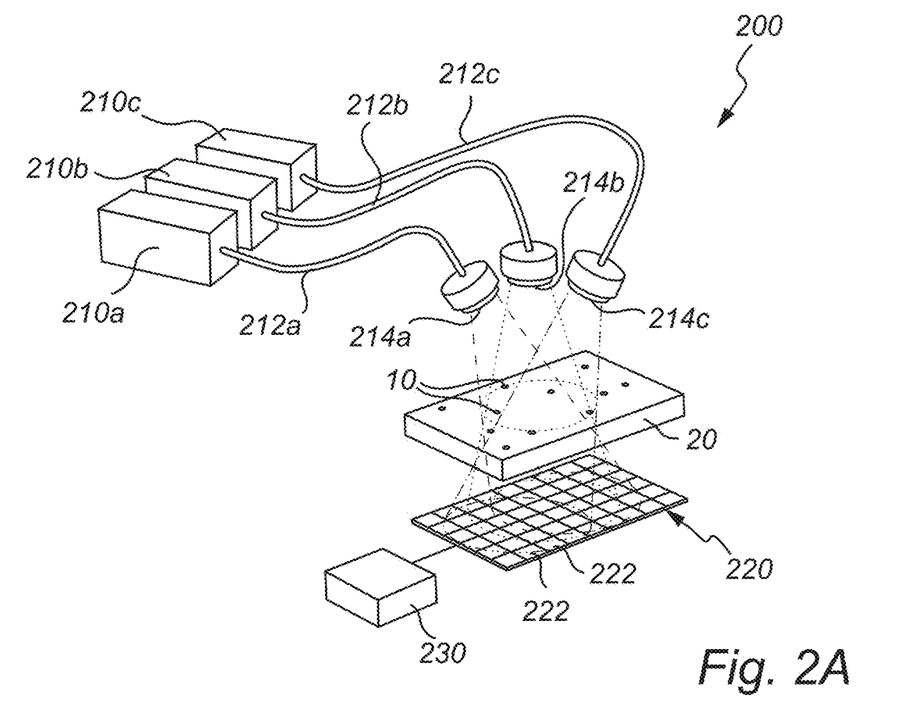
FIG. 2A illustrates a device for imaging microscopic objects comprising three light sources providing three points of operation for illuminating the microscopic objects from slightly different angles on incidence.

FIG. 2A illustrates a device 200 for imaging microscopic objects 10, according to an embodiment of the inventive concept. The device 200 is configured to operate in a wavelength range of at least 400-1200 nm. The device 200 comprises a set of three light sources 210a, 210b, 210d, each of which is a laser configured to generate light at an individual wavelength or at several different wavelengths in an individual wavelength interval within a wavelength range of at least 400-1200 nm, such that the set of light sources 210a, 210b, 210c comprises a first point of operation in which the set of light sources 210a, 210b, 210c is configured to generate light in a visible part of the wavelength range, a second point of operation in which the set of light sources 210a, 210b, 210c is configured to generate light in a short-wave infrared, SWIR, part of the wavelength range, and a third point of operation in which the set of light sources 210a, 210b, 210c is configured to generate light in a near infrared, NIR, part of the wavelength range.

Figure 2B:
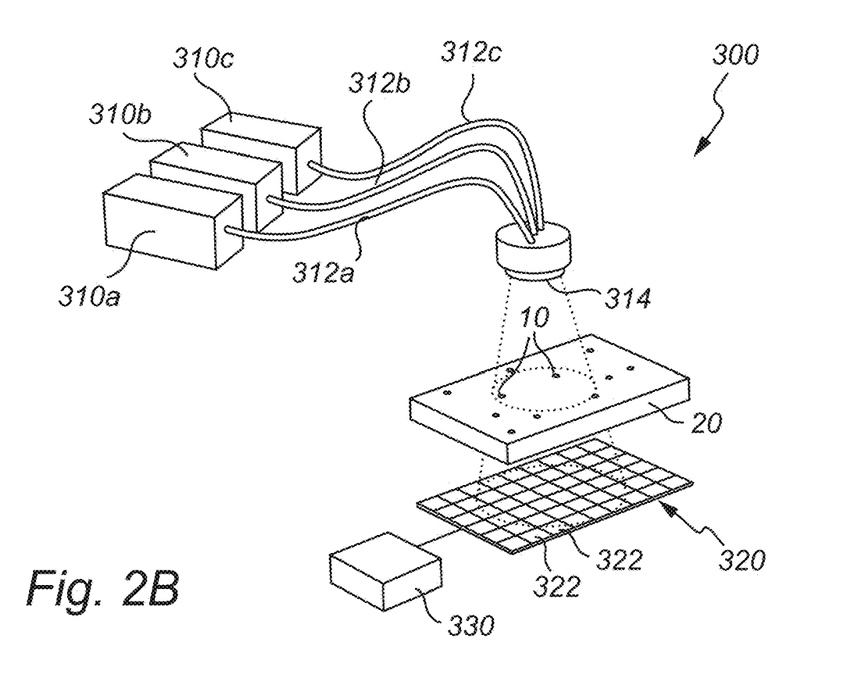
FIG. 2B illustrates a device for imaging microscopic objects comprising three light sources providing three points of operation for illuminating the microscopic objects from the same angle on incidence.

The number of light sources 210a, 210b, 210c is illustrated as being three in FIGS. 2A and 2B. However, it should be understood that the number of light sources, as well as the number of modes of operation, may vary between different embodiments, and therefore may be two or more.

Each of the light sources 210a, 210b, 210c is configured such that the spectral line-width of the generated wavelength does not exceed 100 nm, in order to avoid spectral overlap between the generated wavelengths. It should be realized that other spectral line-widths of the generated wavelengths may be provided, such as spectral line-widths that do not exceed 50 nm or spectral line-widths that do not exceed 10 nm. In particular, when the light source is a laser, a narrow spectral line-width may be provided.

The light from each of the light sources 210a, 210b, 210c is guided by respective optical fibers 212a, 212b, 212c to respective outputs 214a, 214b, 214c. The outputs 214a, 214b, 214c are arranged such that the light exiting the outputs 214a, 214b, 214c is directed towards a microscopic object 10. In this embodiment, an objective slide 20 is used on which microscopic objects 10 are arranged, and the microscopic objects 10 are thereby illuminated on the objective slide 20, at slightly different angles from a first side of the objective slide 20.

The device 200 is configured to set a selected point of operation to the first, second, and third points of operation sequentially, whereby the light sources 210a, 210b, 210c may sequentially illuminate the microscopic objects 10 with the generated light at the wavelengths defined by the first, second, and third points of operation.

At least part of the light is scattered by the microscopic objects 10, whereas non-scattered light passes through the microscopic objects 10 and the objective slide 20. The scattered and non-scattered light is transmitted to a detector 220 on the opposite side of the objective slide 20, the detector 220 comprising an array of light sensitive areas 222. At the detector 220, an interference pattern is formed for each of the wavelengths between light being scattered by the microscopic objects 10 and non-scattered light from the light sources 210a, 210b, 210c.

The array of light sensitive areas 222 is configured to sequentially detect the interference pattern for each wavelength. Each of the light sensitive areas 222 are sensitive to detect light spanning the wavelength range of at least 400-1200 nm, thereby being able to detect light in the full range of wavelengths produced by the light sources 210a, 210b, 210c.

The array of light sensitive areas 222 may selectably be of either InGaAs type or quantum dot image sensor type or another type that is sensitive to detect light spanning the wavelength range of at least 400-1200 nm, similarly as was described in relation to the embodiment illustrated in FIG. 1.

The device 200 further comprises a processor 230 configured to perform digital holographic reconstruction on the interference patterns detected by the array of light sensitive areas 222, thereby generating a three-dimensional monochromatic image of the microscopic objects 10 on the objective slide 20, for each of the wavelengths.

Since the light from the different light sources 210a, 210b, 210c reaches the detector 220 with slightly different angles of incidence, the interference patters may not necessarily be detected such that spatial information of the microscopic objects 10 for each of the wavelengths are aligned with each other. The processor 230 may therefore be further configured to perform intermediate image transformation such as resampling, rescaling, and/or dewarping. Image transformation may facilitate subsequent optional combination of the monochromatic images of the microscopic objects 10, to form an aligned chromatic image of the microscopic objects 10. Alternatively, it is conceivable that the acquired data be transferred to an external unit such as a computer where processing such as image transformation and/or image combination may be performed.

However, it should also be realized that a particular microscopic object 10 may be imaged using only one of the light sources 210a, 210b, 210c, such that there is no need of aligning spatial information acquired for different wavelengths.

FIG. 2B illustrates a device 300 for imaging microscopic objects 10, according to an embodiment of the inventive concept. The device 300 shares a number of features with device 200 illustrated in FIG. 2B, all of which will not be explicitly repeated in this section. The device 300 comprises a set of three light sources 310a, 310b, 310c, of the same type as described for device 200.

The light from each of the light sources 310a, 310b, 310c is guided by optical fibers 312a, 312b, 312c, which are combined to a common output 314, from which light from the light sources 310a, 310b, 310c may exit, following a common aligned light path. The output 314 is arranged such that the light exiting the output 314 illuminates the microscopic objects 10 on the objective slide 20.

Scattered and non-scattered light is transmitted to a detector 320 comprising an array of light sensitive areas 322, of the same type as described for device 200. The array of light sensitive areas 322 is configured to detect the interference pattern for each wavelength.

In the present embodiment, the light from the light sources 310a, 310b, 310c are combined onto a common, aligned light path, prior to exiting the output 314. The illumination therefore follows the same path for each of the wavelengths. Hence, the device 300 is configured to detect the interference patterns at the three wavelengths such that spatial information of the microscopic objects 10 in the interference patterns for each of the wavelengths are aligned with each other on the array of light sensitive areas 322. The present arrangement facilitates combination of the information from each of the wavelengths into aligned chromatic images of the microscopic objects 10.

The device 300 further comprises a processor 330 configured to perform digital holographic reconstruction on the interference patterns detected by the array of light sensitive areas 322, thereby generating a three-dimensional monochromatic image of the microscopic objects 10 on the objective slide 20, for each of the three wavelengths.

The processor 330 may further be configured to combine the monochromatic images of the microscopic objects 10 for each of the wavelengths, to form an aligned chromatic image of the microscopic objects 10. Such combination may be performed without further intermediate image transformation, since the spatial information of the microscopic objects 10 in the interference patterns for each of the wavelengths are aligned with each other.

Figure 3:
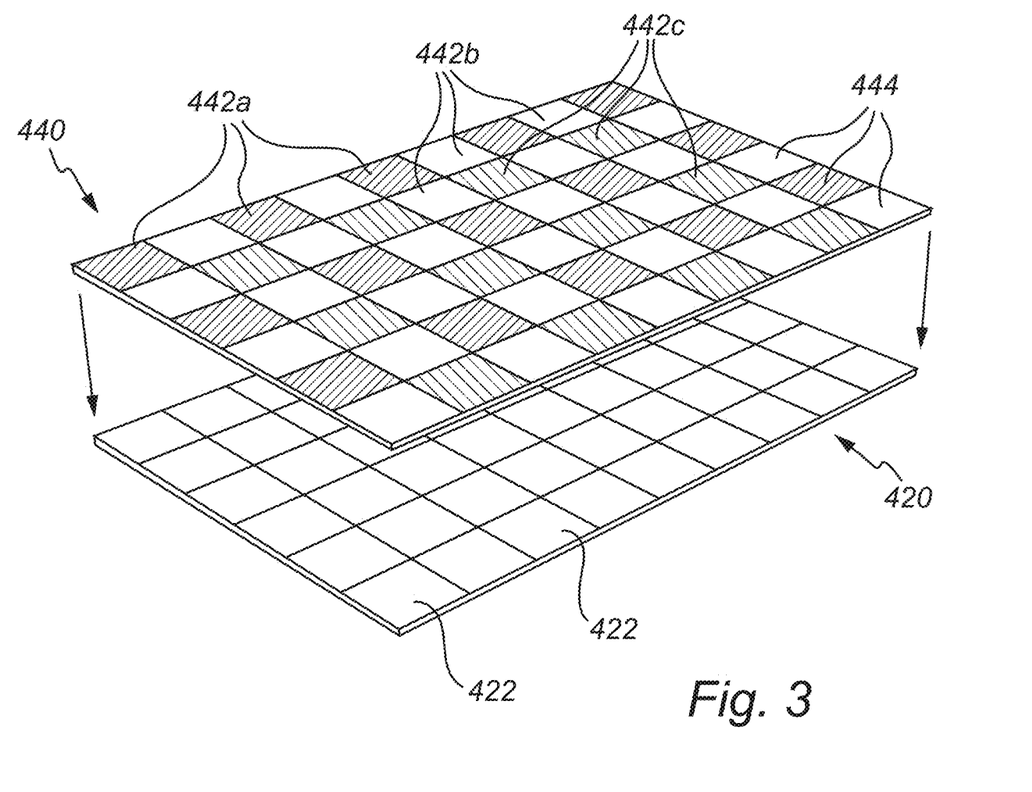
FIG. 3 illustrates detector comprising an array of light sensitive areas, in front of which an array of filters is arranged, enabling simultaneous detection of three wavelengths by the same detector.

FIG. 3 illustrates a detector 420 and an array 440 of filters 444, according to an embodiment of the inventive concept. The array 440 of filters 444 is arranged above the array of light sensitive areas 422 such that light passes the array 440 of filters 444 before reaching the array of light sensitive areas 422. The array 440 of filters 444 may be arranged close to the array of light sensitive areas 422, such as being arranged directly on the array of light sensitive areas 422 or being monolithically integrated with the array of light sensitive areas 422.

The array 440 of filters 444 comprises a plurality of subsets 442a, 442b, 442c of filters 444, each of the filters 444 in the subset 442a, 442b, 442c of filters 444 being arranged in front of a light sensitive area 422. Each of the subsets 442a, 442b, 442c of filters 444 is configured to transmit light at one of the plurality of wavelengths, so that each of the subsets 442a, 442b, 442c of filters 444 transmit light at a different wavelength than other subsets 442a, 442b, 442c. By the present arrangement, each of the wavelengths of the plurality of wavelengths is transmitted through a corresponding subset 442a, 442b, 442c of filters 444, such that some of the light sensitive areas 422 detect the interference pattern for light at a first wavelength, some other light sensitive areas 422 detect the interference pattern for light as a second wavelength, and so on. In the manner described above, a detector assembly may be provided with which light at different wavelengths may be detected by different light sensitive areas 422, thereby allowing simultaneous detection of the individual interference patterns by the same detector 420.

The number of subsets 442a, 442b, 442c of filters 444 is illustrated as being three in FIG. 3. However, it should be understood that the number of subsets of filters may vary between different embodiments, and therefore may be two or more. The number of subsets of filters typically correspond to the number of light wavelengths generated and the number of modes of operation of the device.

Each of the embodiments illustrated in FIGS. 1, 2A, and 2B may optionally be provided with the present array 440 of filters 444, thereby enabling simultaneous detection of the generated wavelengths.

Figure 4:
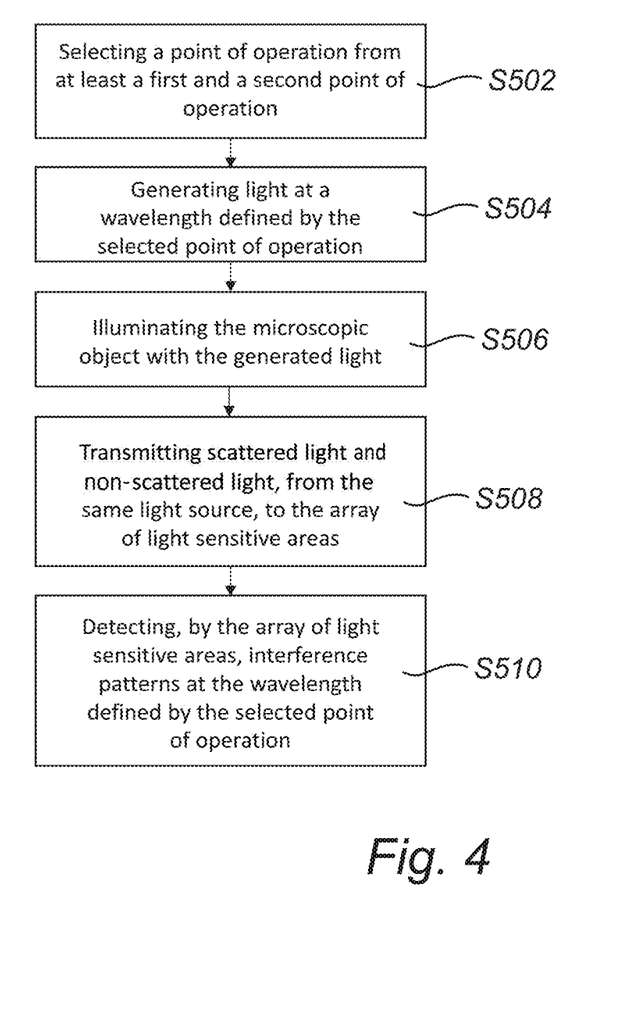
FIG. 4 illustrates a schematic block diagram shortly summarizing the method for imaging a microscopic object.

FIG. 4 illustrates a schematic block diagram shortly summarizing the method for imaging a microscopic object as previously described in relation to the operation of the devices 100, 200, 300. It should be understood that the steps of the method, although listed in a specific order herein, may be performed in any order suitable.

The method may comprise selecting S502 a point of operation from at least a first point of operation in which at least one light source is configured to generate light in a visible part of a wavelength range of at least 400-1200 nm, and a second point of operation in which the at least one light source is configured to generate light in an infrared part of the wavelength range. It should be understood that there may be implementations of the method in which the selecting S502 a point of operation may be performed to set the selected point of operation to a single one of the at least first and second points of operation. It should be understood that there may be implementations of the method in which the selecting S502 a point of operation may be performed to set the selected point of operation to the at least first and second points of operation sequentially. It should be understood that there may be implementations of the method in which the selecting S502 a point of operation may be performed to set the selected point of operation to the at least first and second points of operation simultaneously.

The method may further comprise generating S504, by the at least one light source, light at a wavelength defined by the selected point of operation.

The method may further comprise illuminating S506 the microscopic object with the generated light such that at least part of the light is scattered by the microscopic object, forming scattered light. It should be understood that there may be implementations of the method in which the illuminating S506 the microscopic objects may be performed at a single one of the at least first and second points of operation. It should be understood that there may be implementations of the method in which the illuminating S506 the microscopic objects may be performed at the at least first and second points of operation sequentially. It should be understood that there may be implementations of the method in which the illuminating S506 the microscopic objects may be performed at the at least first and second points of operation simultaneously.

The method may further comprise transmitting S508 the scattered light and non-scattered light, from the same light source, to an array of light sensitive areas, such that an interference pattern is formed by interference between the scattered light and the non-scattered light.

The method may further comprise detecting S510, by an array of light sensitive areas sensitive to detect light spanning the wavelength range, the interference pattern for imaging the microscopic object at the wavelength defined by the selected point of operation. It should be understood that there may be implementations of the method in which the detecting S510 interference patterns may be performed at a single one of the least first and second points of operation. It should be understood that there may be implementations of the method in which the detecting S510 interference patterns may be performed at least first and second points of operation sequentially. It should be understood that there may be implementations of the method in which the detecting S510 interference patterns may be performed at least first and second points of operation simultaneously.

In the above the inventive concept has mainly been described with reference to a limited number of examples. However, as is readily appreciated by a person skilled in the art, other examples than the ones disclosed above are equally possible within the scope of the inventive concept, as defined by the appended claims.

Although the light sources are mainly described herein as being laser light sources, it should be realized that the light source(s) may alternatively be implemented as one or more light emitting diodes (LEDs). The light output by a LED may be guided through a pinhole for generating at least partially coherent light such that an interference pattern may be detected that allows digital holographic reconstruction.

The invention claimed is:

1. A device for imaging of a microscopic object, the device comprising:
an array of light sensitive areas, each of the light sensitive areas being sensitive to detect light spanning a wavelength range of at least 400-1200 nm,
at least one light source comprising at least a first point of operation in which the at least one light source is configured to generate light in a visible part of the wavelength range, and a second point of operation in which the at least one light source is configured to generate light in an infrared part of the wavelength range, the at least one light source being arranged to illuminate the microscopic object with the generated light such that at least part of the light is scattered by the microscopic object, forming scattered light;
wherein the device is configured to transmit the scattered light and non-scattered light, from the same light source, to the array of light sensitive areas, wherein the array of light sensitive areas is configured to detect an interference pattern formed by interference between the scattered light and the non-scattered light;
and wherein the device is further configured to be set in a selected point of operation from the at least first and second points of operation, for detecting the interference pattern for imaging the microscopic object at a wavelength defined by the selected point of operation.

2. The device according to claim 1, wherein, in the second point of operation, the light generated in the infrared part of the wavelength range is in a short-wave infrared, SWIR, part of the wavelength range.

3. The device according to claim 1, wherein the at least one light source is configured to generate light having a spectral line-width equal to or less than 100 nm and being at least partially coherent, for each selected point of operation.

4. The device according to claim 1, wherein the at least one light source comprises one or more lasers and/or one or more laser diodes and/or one or more light emitting diodes, LEDs.

5. The device according to claim 1, wherein the array of light sensitive areas is of Indium Gallium Arsenide, InGaAs, type.

6. The device according to claim 1, wherein the array of light sensitive areas is of quantum dot image sensor type.

7. The device according to claim 1, wherein a pitch of the light sensitive areas in the array of light sensitive areas is not larger than 100 μm.

8. The device according to claim 1, further comprising a processor configured to perform digital holographic reconstruction on the interference pattern detected by the array of light sensitive areas to generate a monochromatic image of the microscopic object at the wavelength defined by the selected point of operation.

9. The device according to claim 1, wherein the device is further configured to set the selected point of operation to the at least first and second points of operation sequentially or simultaneously, and wherein the array of light sensitive areas is configured to sequentially or simultaneously detect the interference patterns for imaging the microscopic object at each of the wavelengths defined by the at least first and second points of operation, and wherein the interference pattern detected at the first point of operation originates from a first part of the microscopic object, and the interference pattern detected at the second point of operation originates from a second part of the microscopic object, the second part of the microscopic object being different from the first part of the microscopic object.

10. The device according to claim 9, further comprising a processor configured to perform digital holographic reconstruction on the interference pattern detected by the array of light sensitive areas to generate a monochromatic image of the microscopic object at the wavelength defined by the selected point of operation, wherein the processor is further configured to combine the monochromatic image of the microscopic object generated for each of the wavelengths defined by the at least first and second points of operation, thereby forming a chromatic image of the microscopic object.

11. The device according to claim 1, wherein the at least one light source further comprises a third point of operation in which the at least one light source is configured to generate light in a part of the wavelength range.

12. The device according to claim 11, wherein in the third point of operation, the light generated is in a near infrared, NIR, part of the wavelength range.

13. The device according to claim 1, wherein:
the at least one light source is arranged at a first side of the microscopic object; and
the array of light sensitive areas is arranged at a second side of the microscopic object, wherein the second side of the microscopic object is opposite to the first side of the microscopic object;
wherein the at least one light source, the microscopic object and the array of light sensitive areas are further arranged to provide a light path from the at least one light source to the array of light sensitive areas through the microscopic object.

14. A method for imaging of a microscopic object, the method comprising:
selecting a point of operation from at least a first point of operation in which at least one light source is configured to generate light in a visible part of a wavelength range of at least 400-1200 nm, and a second point of operation in which the at least one light source is configured to generate light in an infrared part of the wavelength range,
generating, by the at least one light source, light at a wavelength defined by the selected point of operation
illuminating the microscopic object with the generated light such that at least part of the light is scattered by the microscopic object, forming scattered light;
transmitting the scattered light and non-scattered light, from the same light source, to the array of light sensitive areas, such that an interference pattern is formed by interference between the scattered light and the non-scattered light; and
detecting, by an array of light sensitive areas, the interference pattern for imaging the microscopic object at the wavelength defined by the selected point of operation;
wherein each of the light sensitive areas of the array of light sensitive areas are sensitive to detect light spanning the wavelength range.

15. The method according to claim 14, wherein, in the second point of operation, the light generated in the infrared part of the wavelength range is in a short-wave infrared, SWIR, part of the wavelength range.

* * * * *